(12) United States Patent
Chang et al.

(10) Patent No.: US 12,428,293 B2
(45) Date of Patent: Sep. 30, 2025

(54) MICRO-ELECTROMECHANICAL PACKAGING STRUCTURE

(71) Applicant: Merry Electronics(Shenzhen) Co., Ltd., ShenZhen (CN)

(72) Inventors: Yung-Hsiang Chang, Taichung (TW); Jia Yin Wu, Taichung (TW); Yueh-Kang Lee, Taichung (TW)

(73) Assignee: Merry Electronics(Shenzhen) Co., Ltd., ShenZhen (CN)

( * ) Notice: Subject to any disclaimer, the term of this patent is extended or adjusted under 35 U.S.C. 154(b) by 434 days.

(21) Appl. No.: 18/085,513

(22) Filed: Dec. 20, 2022

(65) Prior Publication Data

US 2024/0034620 A1    Feb. 1, 2024

Related U.S. Application Data

(60) Provisional application No. 63/392,137, filed on Jul. 26, 2022.

(30) Foreign Application Priority Data

Sep. 26, 2022   (TW) .................................. 111136337

(51) Int. Cl.
  *B81B 7/00* (2006.01)
(52) U.S. Cl.
  CPC .... *B81B 7/0077* (2013.01); *B81B 2201/0257* (2013.01); *B81B 2203/0127* (2013.01); *B81B 2203/0353* (2013.01); *B81B 2203/04* (2013.01); *B81B 2207/115* (2013.01)

(58) Field of Classification Search
  CPC .......... B81B 7/0061; B81B 2201/0257; B81B 1/002; B81B 1/004; B81C 1/00087; H04R 19/04; H04R 1/086; H04R 19/005; H04R 2201/003
  See application file for complete search history.

(56) References Cited

U.S. PATENT DOCUMENTS

| | | | |
|---|---|---|---|
| 2012/0237073 A1* | 9/2012 | Goida ...................... | H04R 1/02 381/361 |
| 2023/0269543 A1* | 8/2023 | Nakamoto ............. | H04R 19/04 381/91 |

* cited by examiner

*Primary Examiner* — Moazzam Hossain
(74) *Attorney, Agent, or Firm* — JCIPRNET (57) ABSTRACT

A micro-electromechanical packaging structure including a substrate, a sensing module, a waterproof layer, and a cover is provided. The substrate has a first surface, a second surface, and an acoustic hole penetrating through the first surface and the second surface. The acoustic hole has an upper opening and a lower opening, and an aperture of the lower opening is larger than an aperture of the upper opening. The sensing module is disposed on the first surface of the substrate and covers the upper opening. The waterproof layer is disposed on the second surface of the substrate and covers the lower opening. The waterproof layer has multiple fine holes. The fine holes are communicated with the acoustic hole. The cover is disposed on the first surface and covers the sensing module.

11 Claims, 6 Drawing Sheets

MICRO-ELECTROMECHANICAL PACKAGING STRUCTURE

CROSS-REFERENCE TO RELATED APPLICATION

This application claims the priority benefit of U.S. provisional application Ser. No. 63/392,137, filed on Jul. 26, 2022, and Taiwan application serial no. 111136337, filed on Sep. 26, 2022. The entirety of each of the above-mentioned patent applications is hereby incorporated by reference herein and made a part of this specification.

BACKGROUND

Technical Field

The disclosure relates to a micro-electromechanical device, and more particularly, to a micro-electromechanical packaging structure.

Description of Related Art

A micro-electromechanical microphone includes a diaphragm and a back plate, which are fabricated on a silicon chip to receive sound waves and convert the sound waves into electrical signals. The micro-electromechanical microphones have been widely used in notebook computers, smart phones, and various portable electronic products. In recent years, a dustproof and waterproof function of the portable electronic products has also begun to draw attentions.

Regarding the existing micro-electromechanical microphone, in order to avoid water drops in the environment from entering the micro-electromechanical microphone through an acoustic hole to cause damage to a sound receiving module, it is necessary to form multiple fine holes on a substrate at a position corresponding to the sound receiving module. The fine holes may prevent the water drops from entering the micro-electromechanical microphone. However, since an aperture of the fine hole is too small, which increases energy loss of the sound waves when the sound waves are transmitted to a sensing module, a sound receiving performance of the micro-electromechanical microphone is affected.

SUMMARY

The disclosure is directed to a micro-electromechanical packaging structure, which is suitable for a micro-electromechanical microphone, where an acoustic hole with different apertures is formed on a substrate, and one side with the larger aperture is adapted to accommodate more fine holes to reduce energy loss of sound waves when the sound waves are transmitted to a sensing module, so as to maintain a sound receiving performance of the micro-electromechanical microphone.

The disclosure provides a micro-electromechanical packaging structure including a substrate, a sensing module, a waterproof layer, and a cover. The substrate has a first surface, a second surface, and an acoustic hole penetrating through the first surface and the second surface. The acoustic hole has an upper opening and a lower opening, and an aperture of the lower opening is larger than an aperture of the upper opening. The sensing module is disposed on the first surface of the substrate and covers the upper opening. The waterproof layer is disposed on the second surface of the substrate and covers the lower opening. The waterproof layer has multiple fine holes. The fine holes are communicated with the acoustic hole. The cover is disposed on the first surface and covers the sensing module.

In an embodiment of the disclosure, the fine holes are distributed within an area range of a vertical projection of the lower opening and beyond an area range of a vertical projection of the upper opening.

In an embodiment of the disclosure, the acoustic hole has a stepped side surface extending vertically from the first surface to the second surface.

In an embodiment of the disclosure, the acoustic hole has an inclined side surface extending obliquely from the first surface to the second surface.

In an embodiment of the disclosure, the upper opening of the acoustic hole extends vertically from the first surface by a first thickness, and the acoustic hole extends obliquely from a place of the first thickness to the second surface by a second thickness to form the lower opening.

In an embodiment of the disclosure, the sensing module has a chamber correspondingly communicated with the acoustic hole, and an inner diameter of the chamber matches the aperture of the upper opening of the acoustic hole.

In an embodiment of the disclosure, a distance between the upper opening and the lower opening is greater than 50 μm, and is preferably between 50 μm and 75 μm.

In an embodiment of the disclosure, an aperture of each of the fine holes is between 20 μm and 50 μm, and is preferably between 34 μm and 42 μm, and a number of the fine holes is 8 or more, and is preferably between 31 and 48.

In an embodiment of the disclosure, the sensing module further includes at least one electrode, and the electrode is disposed on an outer surface of the waterproof layer away from the substrate.

In an embodiment of the disclosure, the sensing module further includes at least one electrode, and the electrode is disposed on a top surface of the cover.

In an embodiment of the disclosure, the micro-electromechanical packaging structure further includes an elevated layer, which is disposed outside the waterproof layer and has an opening correspondingly communicated with the fine holes.

Based on the above, the micro-electromechanical packaging structure of the disclosure is suitable for the micro-electromechanical microphone, where the acoustic hole with the different apertures is formed on the substrate. At the same time, the waterproof layer is disposed on the substrate. The waterproof layer has the fine holes and is aligned with the acoustic hole, and the sound waves in the environment are sequentially transmitted from the fine holes through the acoustic hole to the sensing module. The side of the acoustic hole with the larger aperture corresponds to the fine holes to increase the number of the fine holes of the waterproof layer within a range of the acoustic hole, while the side of the acoustic hole with the smaller aperture is correspondingly connected to the sensing module, so that the first surface of the substrate has an enough space to load the sensing module. The micro-electromechanical microphone may reduce the energy loss of the sound waves when the sound waves are transmitted to the sensing module by increasing the number of the fine holes without increasing an overall volume, so as to maintain the sound receiving performance of the micro-electromechanical microphone.

In addition, the fine holes of the waterproof layer may effectively prevent water drops from entering the acoustic hole to cause damage to the sensing module.

DESCRIPTION OF THE EMBODIMENTS

Figure 1:
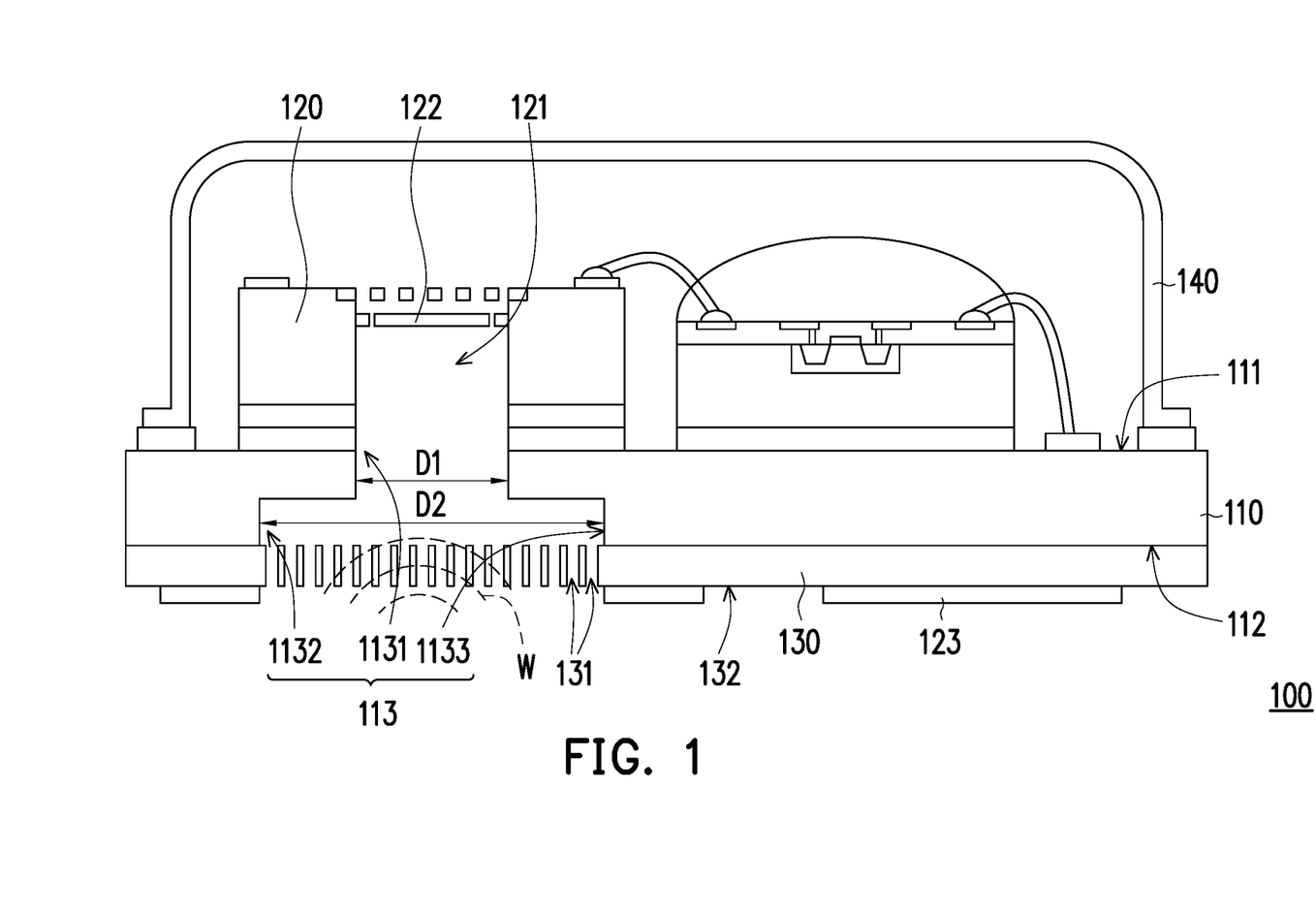
FIG. 1 is a schematic plan view of a micro-electromechanical packaging structure according to a first embodiment of the disclosure.
Figure 2:
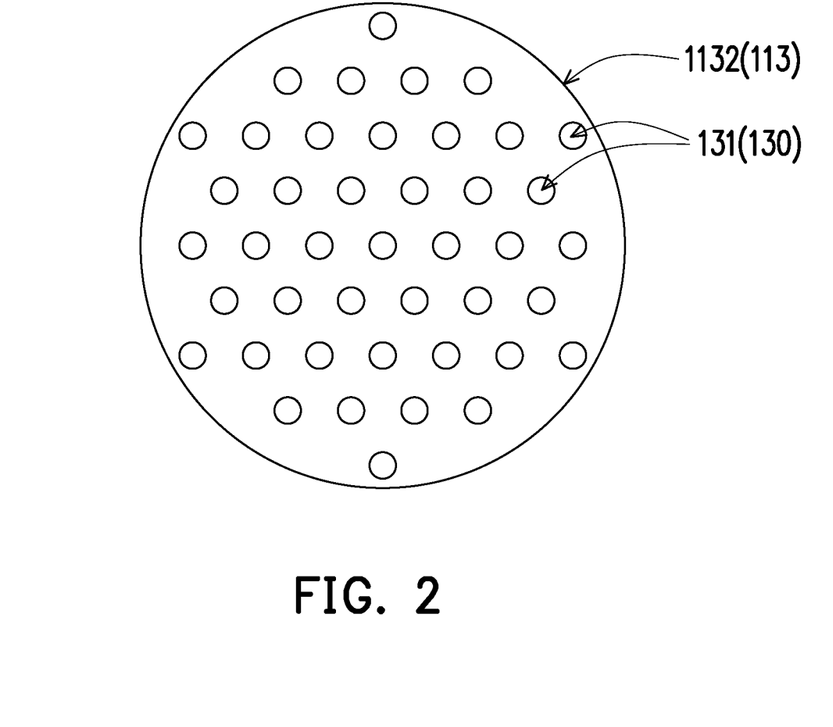
FIG. 2 is a schematic plan view of an acoustic hole and multiple fine holes of the micro-electromechanical packaging structure of FIG. 1.
Figure 3:
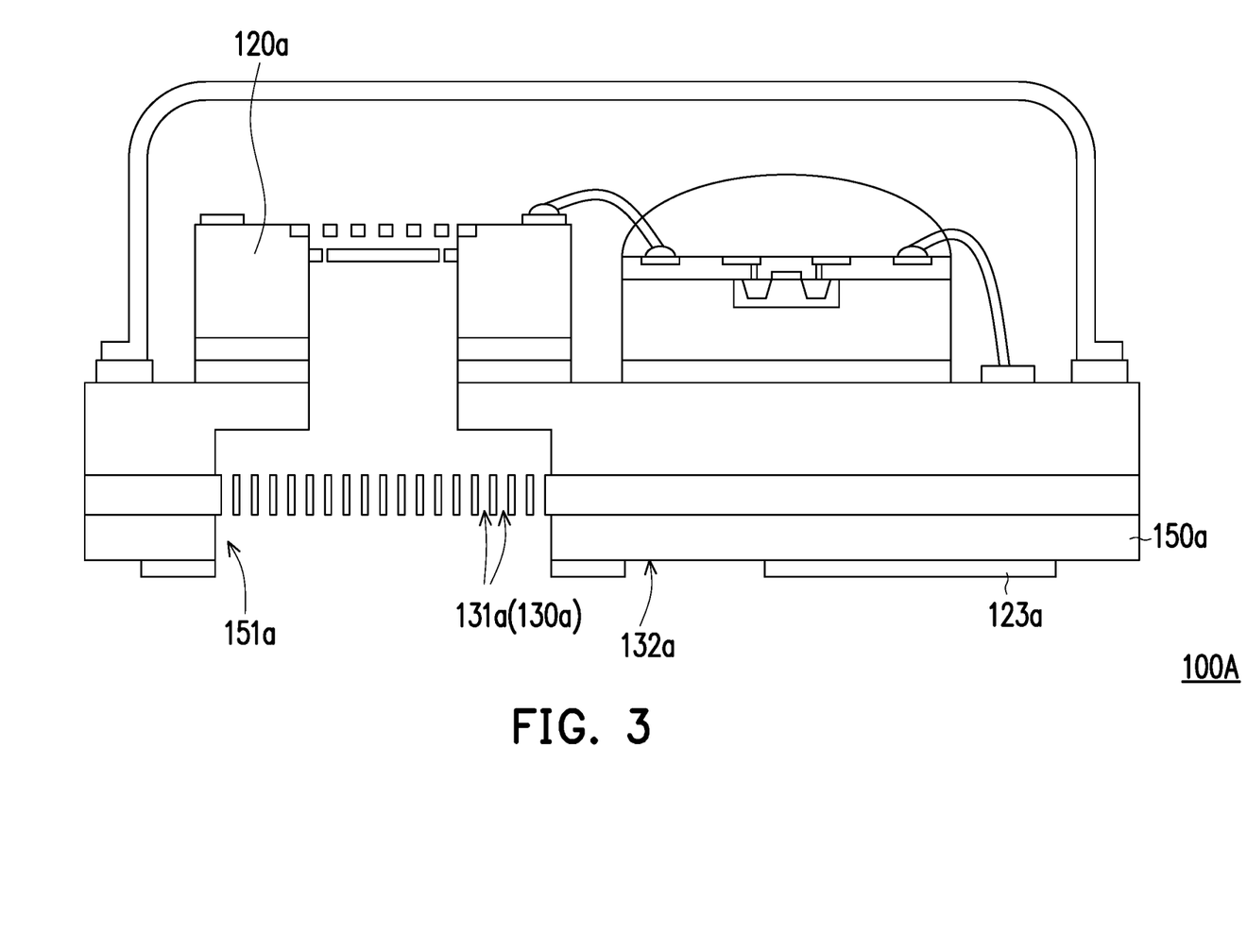
FIG. 3 is a schematic plan view of the micro-electromechanical packaging structure of FIG. 1 combined with an elevated layer.

FIG. 1 is a schematic plan view of a micro-electromechanical packaging structure according to a first embodiment of the disclosure. FIG. 2 is a schematic plan view of an acoustic hole and multiple fine holes of the micro-electromechanical packaging structure of FIG. 1. FIG. 3 is a schematic plan view of the micro-electromechanical packaging structure of FIG. 1 combined with an elevated layer.

Referring to FIG. 1, the micro-electromechanical packaging structure of the disclosure is suitable for a micro-electromechanical microphone, and is formed by packaging a substrate, a sensing module, an application-specific integrated circuit (ASIC), and a housing. The substrate is, for example, a circuit board and has metal lines, and the sensing module and the ASIC are electrically coupled to the metal lines of the substrate. In addition, the ASIC and the sensing module are coupled to each other through wire bonding.

Referring to FIG. 1, a micro-electromechanical packaging structure 100 of the embodiment includes a substrate 110, a sensing module 120, a waterproof layer 130, and a cover 140.

The substrate 110 has a first surface 111, a second surface 112, and an acoustic hole 113 penetrating through the first surface 111 and the second surface 112. The acoustic hole 113 has an upper opening 1131 and a lower opening 1132, and an aperture D2 of the lower opening 1132 is larger than an aperture D1 of the upper opening 1131. The acoustic hole 113 is used to transmit a sound wave W in an environment.

Further, the acoustic hole 113 has a stepped side surface extending vertically from the first surface to the second surface, and a distance between the upper opening 1131 and the lower opening 1132 is greater than 50 µm, and is preferably between 50 µm and 75 µm. The aperture D1 of the acoustic hole 113 extends vertically from the first surface 111 by a distance of 25 µm-37.5 µm, and the aperture D2 of the acoustic hole 113 extends vertically from the distance of 25 µm-37.5 µm to the second surface 112 to form the stepped side surface 1133.

The sensing module 120 is disposed on the first surface 111 of the substrate 110 and covers the upper opening 1131 of the acoustic hole 113. The sensing module 120 is a microphone sensor and has a chamber 121 and a diaphragm 122. The chamber 121 is correspondingly communicated with the acoustic hole 113, and a size and a shape of an inner diameter of the chamber 121 match the aperture D1 of the upper opening 1131 of the acoustic hole 113.

In addition, when the sound wave W enters the chamber 121 through the acoustic hole 113, the sound wave W generates a pressure difference in the chamber 121 to cause vibration of the diaphragm 122, and the diaphragm 122 converts such vibration into an electronic signal. Then, the electronic signal is sequentially transmitted to the ASIC and a speaker to output an audio.

Referring to FIG. 1 and FIG. 2, the waterproof layer 130 is disposed on the second surface 112 of the substrate 110 and covers the lower opening 1132 of the acoustic hole 113. The waterproof layer 130 has multiple fine holes 131. The fine holes 131 are communicated with the acoustic hole 113 and are distributed within a range of the lower opening 1132. In detail, the fine holes 131 are distributed within an area range of a vertical projection of the lower opening 1132 and beyond an area range of a vertical projection of the upper opening 1131. The fine holes 131 are evenly distributed within the area range of the lower opening 1132. The cover 140 is disposed on the first surface 111 and covers the sensing module 120.

Referring to FIG. 2, in the embodiment, an aperture of each fine hole 131 is between 20 µm and 50 um, and is preferably between 34 µm and 42 µm, and a number of the fine holes is 31 to 48. In the embodiment, the aperture of the fine hole 131 needs to be less than or equal to 42 µm to meet a waterproof standard without causing excessive sound wave damping, but the aperture of the fine hole 131 cannot be less than 34 µm, and if the aperture of the fine hole 131 is smaller than 34 µm, the energy loss of the sound waves when passing through the fine holes 131 will increase, which is not conducive to sound wave sensing of the sensing module 120. The number of the fine holes 131 is adjusted to 31 to 48 according to the size of the aperture D2 of the lower opening 1132, and the fine holes 131 are evenly distributed in the area range of the lower opening 1132.

For example, when the aperture D2 of the lower opening 1132 of the acoustic hole 113 is 800 µm, the number of the fine holes 131 is 31, and when the aperture D2 of the lower opening 1132 of the acoustic hole 113 is 1000 mm, the number of the fine holes 131 is 48.

In other embodiments, the number of fine holes may also be less than 31 or greater than 48, depending on the size of the acoustic hole, and the disclosure does not limit the number of the fine holes.

Referring to FIG. 1, the sensing module 120 includes at least one electrode 123. In the embodiment, the number of the at least one electrode 123 is plural, and the electrodes 123 are configured on an outer surface 132 of the waterproof layer 130 away from the substrate 110.

In addition, the electrodes 123 are used to couple to a motherboard of a computer, a notebook computer or a smart phone to supply power to the sensing module 120.

Referring to FIG. 3, a micro-electromechanical packaging structure 100A of the embodiment further includes an elevated layer 150a disposed outside the waterproof layer 130a and having an opening 151a correspondingly communicated with multiple fine holes 131a. The elevated layer 150a is used to support the waterproof layer 130a, thereby preventing the waterproof layer 130a from directly contacting the motherboard or other mechanical components to cause damage to the fine holes 131a of the waterproof layer 130a. In addition, the electrodes 123a of the sensing module 120a are disposed on a side of the elevated layer 150a away from the waterproof layer 130a.

Figure 4:
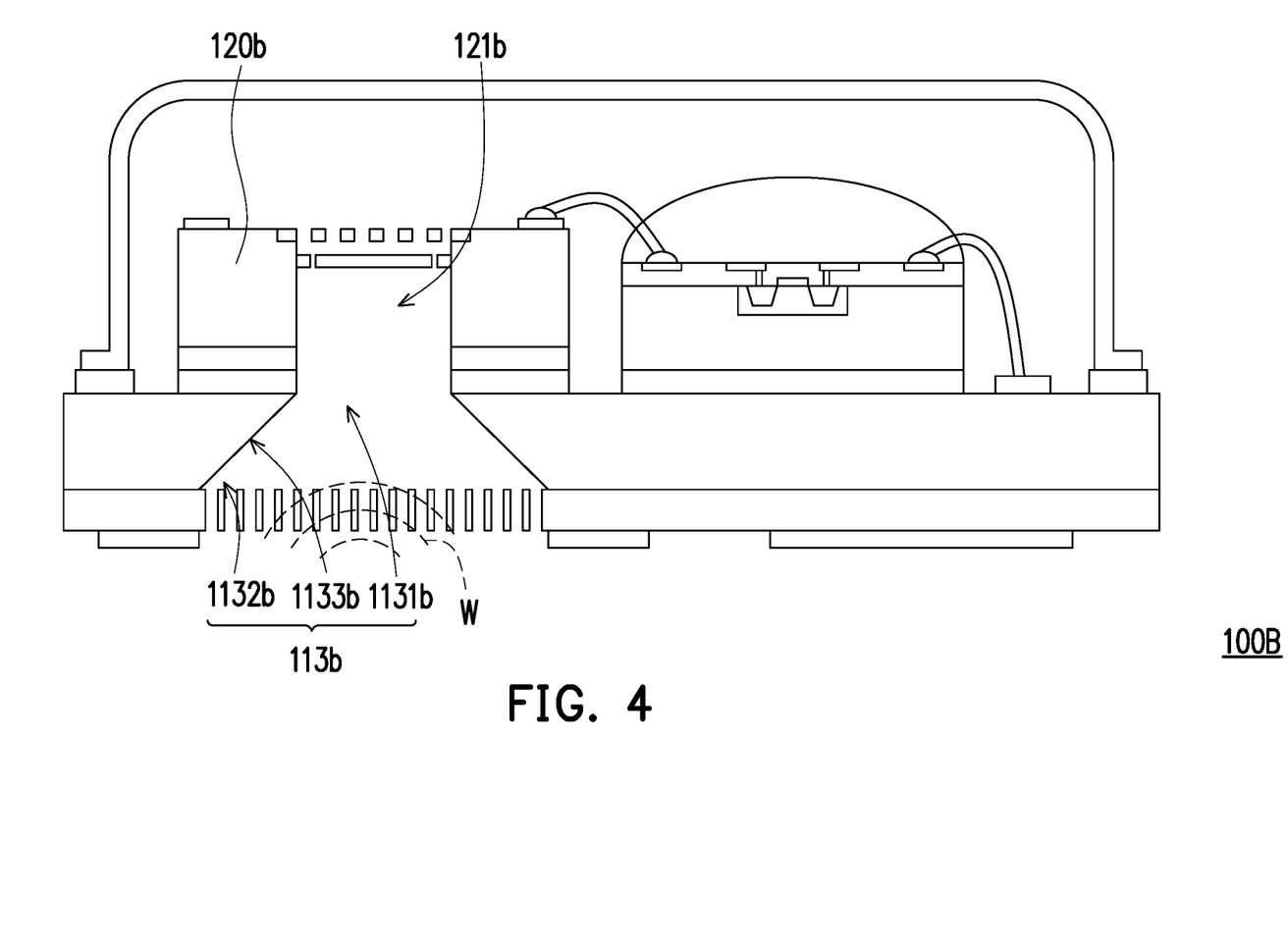
FIG. 4 is a schematic plan view of a micro-electromechanical packaging structure according to a second embodiment of the disclosure.

Referring to FIG. 4, a micro-electromechanical packaging structure 100B of the embodiment is different from the micro-electromechanical packaging structure 100 shown in FIG. 1 in that an acoustic hole 113b has an inclined side surface 1133b extending obliquely from the first surface 111b to the second surface 112b. In detail, a width of the inclined side surface 1133b of the acoustic hole 113b gradually increases from an upper opening 1131b toward a lower opening 1132b, so that while the second surface of the substrate retains a sufficient opening space, the first surface of the substrate also has a sufficient loading space. When the sound wave W enters the acoustic hole 113b from the lower opening 1132b, the sound wave W passes through the upper opening 1131b along the inclined side surface 1133b with gradually decreased width, and enter a chamber 121b of a sensing module 120b.

Figure 5:
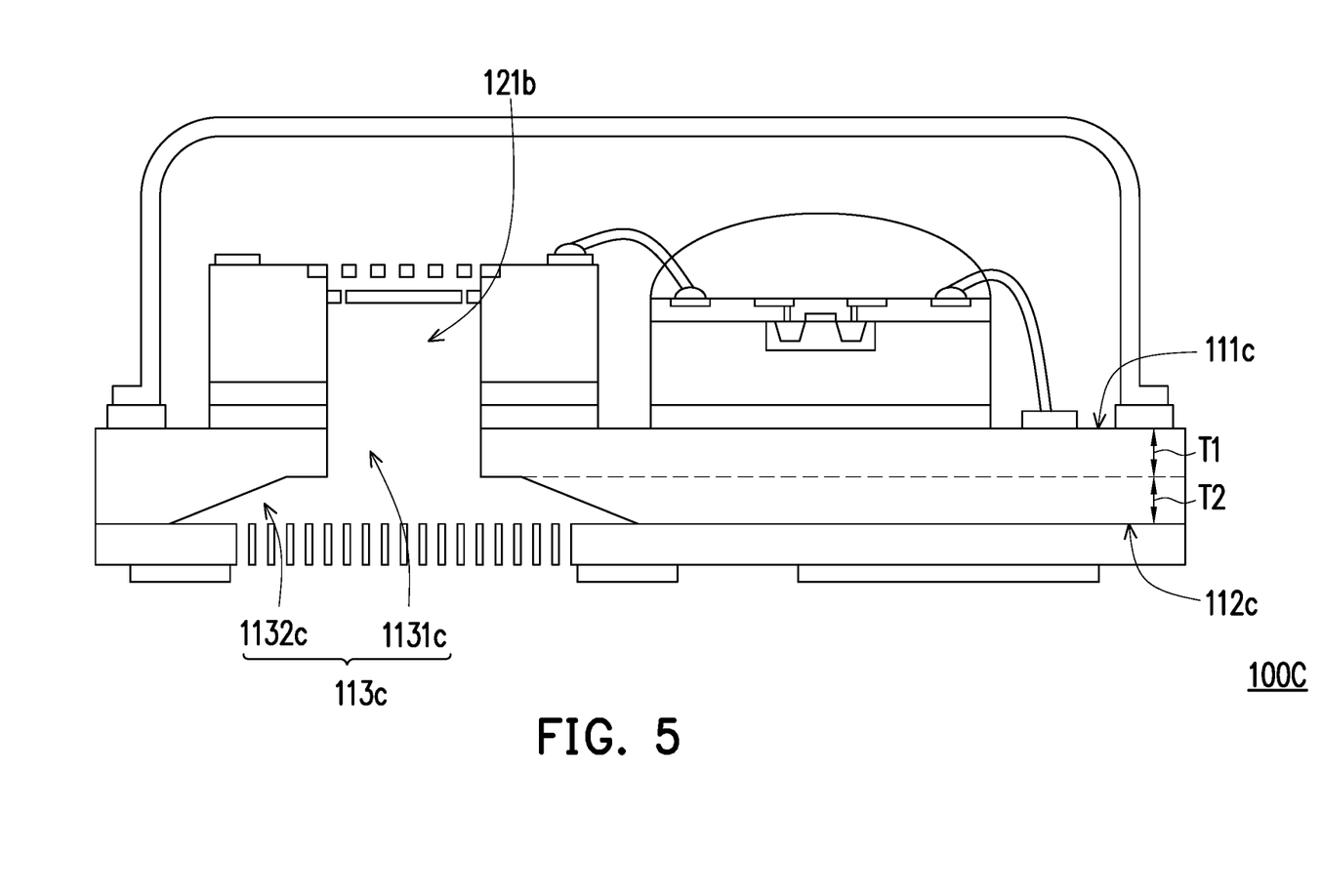
FIG. 5 is a schematic plan view of a micro-electromechanical packaging structure according to a third embodiment of the disclosure.

Referring to FIG. 5, a micro-electromechanical packaging structure 100C of the embodiment is different from the micro-electromechanical packaging structure 100 shown in FIG. 1 in that an upper opening 1131c of an acoustic hole 113c extends vertically from a first surface 111c by a first thickness T1, and the acoustic hole 113c extends obliquely from a place of the first thickness T1 to the second surface 112c by a second thickness T2 to form a lower opening 1132c. In detail, an inner diameter of a chamber 121c matches an aperture D1 of the upper opening 1131c of the acoustic hole 113c, and the width of the acoustic hole 113c gradually increases from the place of the first thickness T1 toward the lower opening 1132c, so that while the second surface of the substrate retains an enough opening space, the first surface of the substrate also has a sufficient loading space.

Figure 6:
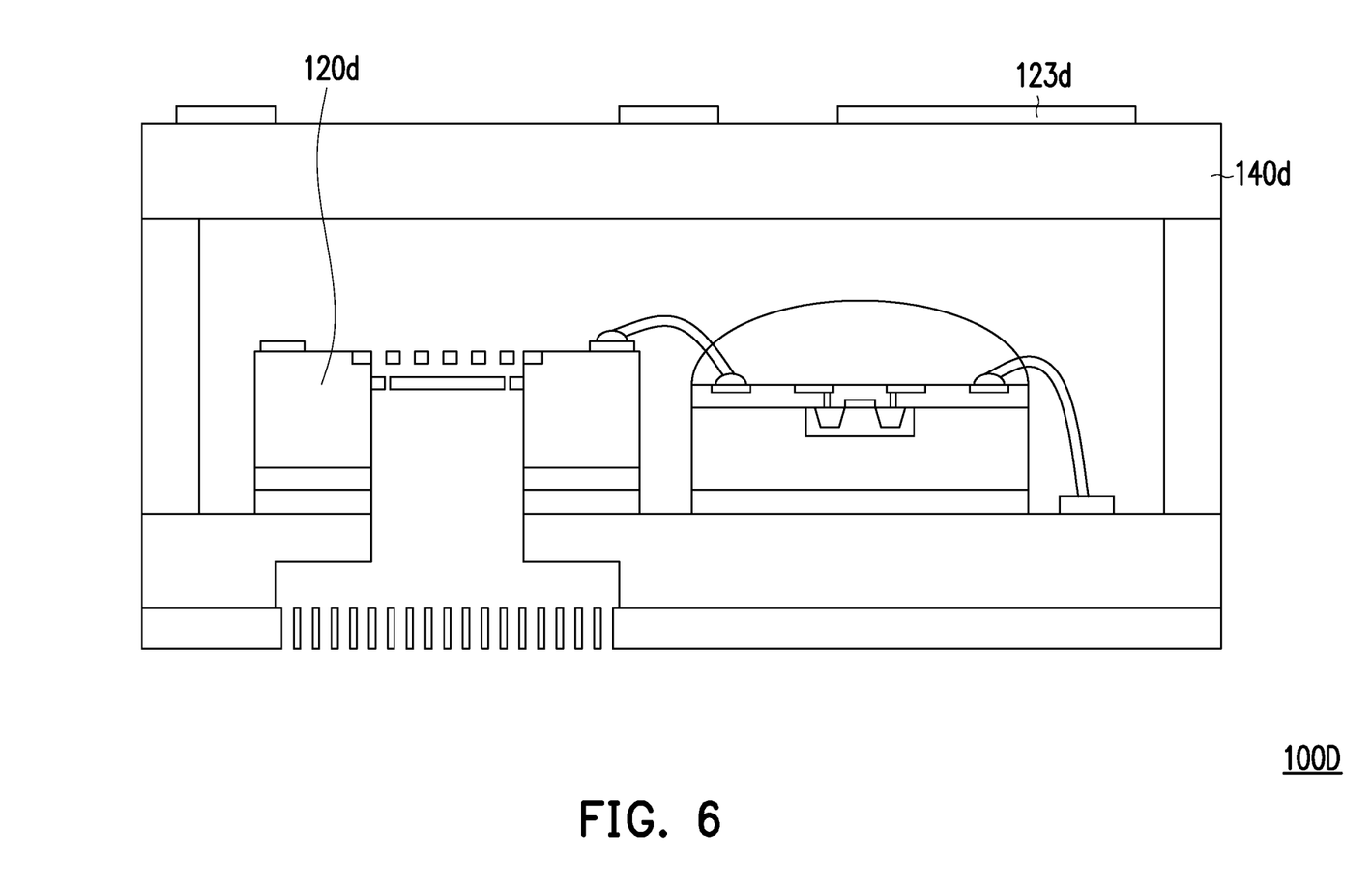
FIG. 6 is a schematic plan view of a micro-electromechanical packaging structure according to a fourth embodiment of the disclosure.

Referring to FIG. 6, a micro-electromechanical packaging structure 100D of the embodiment is different from the micro-electromechanical packaging structure 100 shown in FIG. 1 in that a sensing module 120d includes at least one electrode 123d. A number of the at least one electrode 123d is plural, and the electrodes 123d are disposed on a top surface of the cover 140d. In addition, the electrodes 123d are coupled to a motherboard of a computer, a notebook computer or a smart phone to supply power to the sensing module 120d.

Based on the above, the micro-electromechanical packaging structure of the disclosure is suitable for the micro-electromechanical microphone, where the acoustic hole with the different apertures is formed on the substrate. At the same time, the waterproof layer is disposed on the substrate. The waterproof layer has the fine holes and is aligned with the acoustic hole, and the sound waves in the environment are sequentially transmitted from the fine holes through the acoustic hole to the sensing module. The side of the acoustic hole with the larger aperture corresponds to the fine holes to increase the number of the fine holes of the waterproof layer within a range of the acoustic hole, while the side of the acoustic hole with the smaller aperture is correspondingly connected to the sensing module, so that the first surface of the substrate has an enough space to load the sensing module. The micro-electromechanical microphone may reduce the energy loss of the sound waves when the sound waves are transmitted to the sensing module by increasing the number of the fine holes without increasing an overall volume, so as to maintain the sound receiving performance of the micro-electromechanical microphone.

In addition, the fine holes of the waterproof layer may effectively prevent water drops from entering the acoustic hole to cause the damage to the sensing module.

What is claimed is:

1. A micro-electromechanical packaging structure, comprising:
    a substrate, having a first surface, a second surface, and an acoustic hole penetrating through the first surface and the second surface, wherein the acoustic hole has an upper opening and a lower opening, and an aperture of the lower opening is larger than an aperture of the upper opening;
    a sensing module, disposed on the first surface of the substrate and covering the upper opening;
    a waterproof layer, disposed on the second surface of the substrate and covering the lower opening, wherein the waterproof layer has a plurality of fine holes, and the fine holes are communicated with the acoustic hole; and
    a cover, disposed on the first surface and covering the sensing module,
    wherein, the upper opening and the lower opening are jointly arranged between the sensing module and the waterproof layer, and the lower opening corresponds to the plurality of fine holes, and the upper opening is correspondingly connected to the sensing module.

2. The micro-electromechanical packaging structure according to claim 1, wherein the fine holes are distributed within an area range of a vertical projection of the lower opening and beyond an area range of a vertical projection of the upper opening.

3. The micro-electromechanical packaging structure according to claim 1, wherein the acoustic hole has a stepped side surface extending vertically from the first surface to the second surface.

4. The micro-electromechanical packaging structure according to claim 1, wherein the acoustic hole has an inclined side surface extending obliquely from the first surface to the second surface.

5. The micro-electromechanical packaging structure according to claim 1, wherein the upper opening of the acoustic hole extends vertically from the first surface by a first thickness, and the acoustic hole extends obliquely from a place of the first thickness to the second surface by a second thickness to form the lower opening.

6. The micro-electromechanical packaging structure according to claim 1, wherein the sensing module has a chamber correspondingly communicated with the acoustic hole, and an inner diameter of the chamber matches the aperture of the upper opening of the acoustic hole.

7. The micro-electromechanical packaging structure according to claim 1, wherein a distance between the upper opening and the lower opening is between 50 μm and 75 μm.

8. The micro-electromechanical packaging structure according to claim 1, wherein an aperture of each of the fine holes is between 34 μm and 42 μm, and a number of the fine holes is 31 to 48.

9. The micro-electromechanical packaging structure according to claim 1, wherein the sensing module further comprises at least one electrode, and the electrode is disposed on an outer surface of the waterproof layer away from the substrate.

10. The micro-electromechanical packaging structure according to claim 1, wherein the sensing module further comprises at least one electrode, and the electrode is disposed on a top surface of the cover.

11. The micro-electromechanical packaging structure according to claim 1, further comprising an elevated layer disposed outside the waterproof layer and having an opening correspondingly communicated with the fine holes.

\* \* \* \* \*